(12) United States Patent
Lee et al.

(10) Patent No.: US 7,657,144 B2
(45) Date of Patent: Feb. 2, 2010

(54) OPTOELECTRIC PRINTED CIRCUIT BOARD, METHOD OF MANUFACTURING THE SAME, AND OPTOELECTRIC TRANSMISSION METHOD USING THE OPTOELECTRIC PRINTED CIRCUIT BOARD

(75) Inventors: Myung Hyun Lee, Daejeon (KR); Suntak Park, Daejeon (KR); Jung Jin Ju, Daejeon (KR); Min Su Kim, Daejeon (KR); Seung Koo Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/677,087

(22) Filed: Feb. 21, 2007

(65) Prior Publication Data
US 2007/0196067 A1    Aug. 23, 2007

(30) Foreign Application Priority Data
Feb. 21, 2006    (KR)    ............ 10-2006-0016664

(51) Int. Cl.
*G02B 6/10*    (2006.01)
(52) U.S. Cl. ............ 385/129; 385/14; 385/39; 385/40
(58) Field of Classification Search ............ 385/14–31, 385/39–43, 88, 147, 129; 372/6; 250/227.1
See application file for complete search history.

(56) References Cited

U.S. PATENT DOCUMENTS

| 5,125,054 | A | 6/1992 | Ackley et al. |
| 6,285,808 | B1 | 9/2001 | Mehlhorn et al. |
| 6,442,321 | B1 | 8/2002 | Berini |
| 6,611,635 | B1 * | 8/2003 | Yoshimura et al. ............ 385/14 |
| 6,614,960 | B2 * | 9/2003 | Berini ............ 385/39 |
| 6,614,990 | B1 * | 9/2003 | Nishida et al. ............ 386/125 |
| 6,967,222 | B2 * | 11/2005 | Khanarian et al. ............ 521/77 |
| 7,043,134 | B2 * | 5/2006 | Berini et al. ............ 385/147 |

FOREIGN PATENT DOCUMENTS

| JP | 08-078657 | 3/1996 |
| JP | 09-281352 | 10/1997 |
| JP | 2001-235643 | 8/2001 |
| KR | 1020030094509 | 12/2003 |

OTHER PUBLICATIONS

Van Steenberge, G., et al., "MT-Compatible Laser-Ablated Interconnections for Optical Printed Circuit Boards." Sep. 2004. *Journal of Lightwave Technology*, vol. 22, No. 9, pp. 2083-2090.
Boltasseva, A., et al., "Integrated Optical Components Utilizing Long-Range Surface Plasmon Polaritons." Jan. 2005. *Journal of Lightwave Technology*, vol. 23, No. 1, pp. 413-422.
Berini., P., "Plasmon-polariton modes guided by a metal film of finite width." Aug. 1, 1999. *Optics Letters*, vol. 24, No. 15, pp. 1011-1013.

* cited by examiner

*Primary Examiner*—Brian M. Healy
*Assistant Examiner*—Guy G Anderson
(74) *Attorney, Agent, or Firm*—Ladas & Parry LLP

(57) ABSTRACT

Provided are an optoelectric printed circuit board (PCB) including an optoelectric transmission metal track and a dielectric layer, an optoelectric transmission method using the optoelectric PCB, and a method of manufacturing the optoelectric PCB. The optoelectric transmission method includes injecting light and electricity to the optoelectric PCB including at least one optoelectric transmission metal track and a dielectric layer contacting the optoelectric transmission metal track. The injected light and electricity are transmitted through the optoelectric PCB. The transmitted light and electricity are emitted from the optoelectric PCB.

7 Claims, 6 Drawing Sheets

OPTOELECTRIC PRINTED CIRCUIT BOARD, METHOD OF MANUFACTURING THE SAME, AND OPTOELECTRIC TRANSMISSION METHOD USING THE OPTOELECTRIC PRINTED CIRCUIT BOARD

CROSS-REFERENCE TO RELATED PATENT APPLICATION

This application claims the benefit of Korean Patent Application No. 10-2006-0016664, filed on Feb. 21, 2006 in the Korean Intellectual Property Office, the disclosure of which is incorporated herein in its entirety by reference.

BACKGROUND OF THE INVENTION

1. Field of the Invention

The present invention relates to a method of transmitting light and electricity using the same optoelectric printed circuit board (PCB) using surface plasmon polaritons (SPP).

2. Description of the Related Art

Generally, in optoelectric printed circuit boards (PCBs), light is transmitted by a multi-mode optical waveguide formed of a dielectric layer formed of glass, silica, polymer, etc., and electricity is transmitted through electrical tracks formed of a metal such as copper. Accordingly, in a conventional optoelectric PCB, an optical waveguide and electrical tracks are formed separately using different materials for each, and thus the process of manufacturing is complicated and the number of processes is great. Also, since a conventional PCB uses multi-mode transmission, enhancement in transmission speed is limited.

Surface plasmon polaritons occur at the interface of materials with a positive dielectric constant and a negative dielectric constant in the form of quasi-two-dimensional waves along the interface of the materials. For example, surface plasmon polaritons may occur at the interface between a dielectric such as silica, glass, etc. and a metal thin layer formed inside the dielectric. Such surface plasmon polaritons excited by injected light in one portion and proceed and can emit light again in other portions. Thus, such surface plasmon polaritons can be used in an optical waveguide. However, when the optical waveguide is formed of a metal, light is absorbed by free electrons in the metal due to the high energy of light by ultra high frequency, that is, photon energy, and thus the light is weakened within a few micrometers, and this is too a short distance for light to be used for optical propagation.

SUMMARY OF THE INVENTION

The present invention provides a method of transmitting light and electricity, that is, an optoelectric transmission method, using surface plasmon polaritons using the same printed circuit board (PCB).

The present invention also provides an optoelectric PCB that can transmit light and electricity.

The present invention also provides a method of manufacturing an optoelectric PCB that can transmit light and electricity. According to an aspect of the present invention, there is provided an optoelectric transmission method using an optoelectric printed circuit board (PCB). The optoelectric transmission method may comprise: injecting light and electricity to an optoelectric printed circuit board (PCB); transmitting the light and the electricity through the optoelectric PCB; and emitting the light and the electricity from the optoelectric PCB may comprise at least one optical transmission metal track and a dielectric layer contacting the optical transmission metal track.

The optoelectric PCB can transmit light using surface plasmon polaritons (SPP) generated at the interface between the optical transmission metal track and the dielectric layer and transmit electricity through the optical transmission metal track.

The optoelectric PCB may comprise: an optical transmission metal track transmitting light; an electric transmission metal track which is thicker than the optical transmission metal track and transmits electricity; and a dielectric layer contacting the optical transmission metal track. The optoelectric PCB can transmit light using SPPs generated between the optical transmission metal track and the dielectric layer and transmit electricity through the electric transmission metal track.

Also, the present invention may comprise an optoelectric PCB.

The optoelectric PCB according to an aspect of the present invention may comprises at least one optical transmission metal track and a dielectric layer contacting the optical transmission metal track.

At least one optical transmission metal track may be included.

The optical transmission metal track can transmit light and electricity using the same metal track because the difference between light and electricity is great and thus interference is not caused. The optical transmission metal track may have a thickness of 5 through 200 nm and a width of 2 through 100 μm.

According to another aspect of the present invention, there is provided a optical transmission PCB comprising: an optical transmission metal track transmitting light; an electric transmission metal track which is thicker than the optical transmission metal track and transmits electricity; and a dielectric layer contacting the optical transmission metal track. Thus light and electricity can be transmitted through different metal tracks. The electric transmission metal track may be thicker than the optical transmission metal track. The optical transmission metal track may have a thickness of 5 to 200 nm and a width of 2 to 100 μm. The electric transmission metal track may have a thickness and a width of 100 nm to 5 mm both.

The dielectric layer may comprise a low loss polymer. The low loss polymer may include a halogen such as fluorine or a heavy hydrogen in a general polymer. An example of the low loss polymer may be fluorinated poly arylene ether (FPAE).

The optoelectric transmission metal track, the optical transmission metal track, and the electricity transmission metal track may include a noble metal, that is, IB group elements or an alloy thereof. The elements of the noble metal groups can easily induce generation of surface plasmon polaritons when the electric conductivity of the noble metal group is good.

Also, the electricity transmission metal track may further include a transition metal such as aluminium for aluminium has excellent electric conductivity.

The optoelectric PCBs may further include a substrate. The substrate may be silicon, polyimide, etc.

According to another aspect of the present invention, there is provided a method of manufacturing an optoelectric PCB.

The method may comprises forming a lower dielectric layer on a substrate; forming an optical transmission metal track on the lower dielectric layer; and forming an upper dielectric layer on the optical transmission metal track.

The optoelectric transmission metal track may be formed by forming a metal layer on the lower dielectric layer, forming an etching mask for forming an optical transmission metal track in the metal layer, and etching the metal layer using the etching mask.

According to another aspect of the present invention, there is provided a method of manufacturing an optoelectric PCB, the method comprising: forming a lower dielectric layer on a substrate; forming an optical transmission metal track on the lower dielectric layer; forming an upper dielectric layer on the optoelectric transmission metal track; and forming an electric transmission metal track to be thicker than the optical transmission metal track.

When an electric transmission metal track is formed on the lower dielectric layer, a metal layer is formed on the lower dielectric layer and a first etching mask for forming an optical transmission metal track and an electric transmission metal track is formed on the metal layer. Then the metal layer is etched using the first etching mask to respectively form the optical transmission metal track and the electric transmission metal track. Then the first etching mask is removed, and a second etching mask for exposing the optical transmission metal track is formed, and the optical transmission metal track is etching using the second etching mask. Accordingly, the thickness of the optical transmission metal track may be greater than the thickness of the electric transmission metal track.

When the optoelectric transmission metal track is formed of an optical transmission metal track and an electric transmission metal track, respectively, a metal layer is formed on the lower dielectric layer and a first etching mask for forming an optical transmission metal track and an electric transmission metal track is formed on the metal layer. Then the metal layer is etched using the first etching mask to form the optical transmission metal track and the electric transmission metal track. The first etching mask is removed and a deposition mask for exposing the electric transmission metal track is formed, and metal is further deposited on the optical transmission metal track using the deposition mask. Accordingly, the thickness of the electric transmission metal track may be greater than the thickness of the optical transmission metal track.

When the electric transmission metal track is formed on an upper dielectric layer, a lower dielectric layer is formed and a first metal layer is formed on the lower dielectric layer, and a first etching mask for forming an optical transmission metal track is formed. The first metal layer is etched using the first etching mask to form an optical transmission metal track. Then the first etching mask is removed and the upper dielectric layer is formed, and a second metal layer having a greater thickness than the first metal layer is formed. In addition, a second etching mask for forming an electric transmission metal track is formed on the second metal layer. The second metal layer is etched using the second etching mask to form an electric transmission metal track. Then the second etching mask is removed.

The method may further comprise removing the substrate, and thus a flexible optoelectric PCB including a dielectric can be manufactured.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
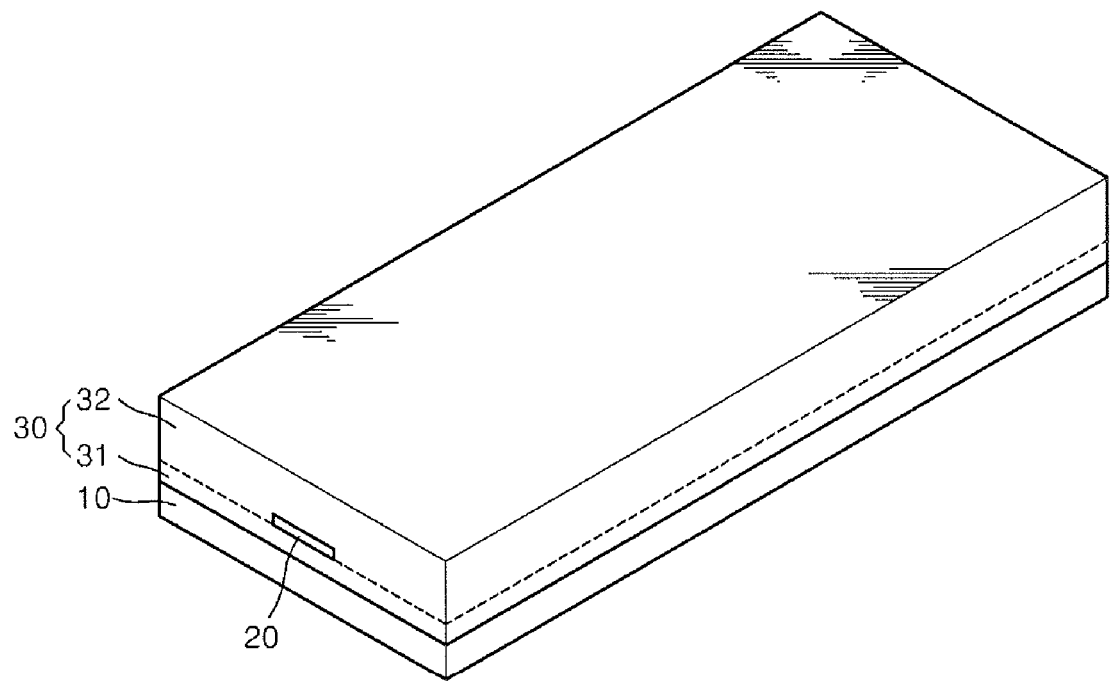
FIG. 1 is a perspective view of an optoelectric printed circuit board (PCB) according to an embodiment of the present invention.
Figure 2:
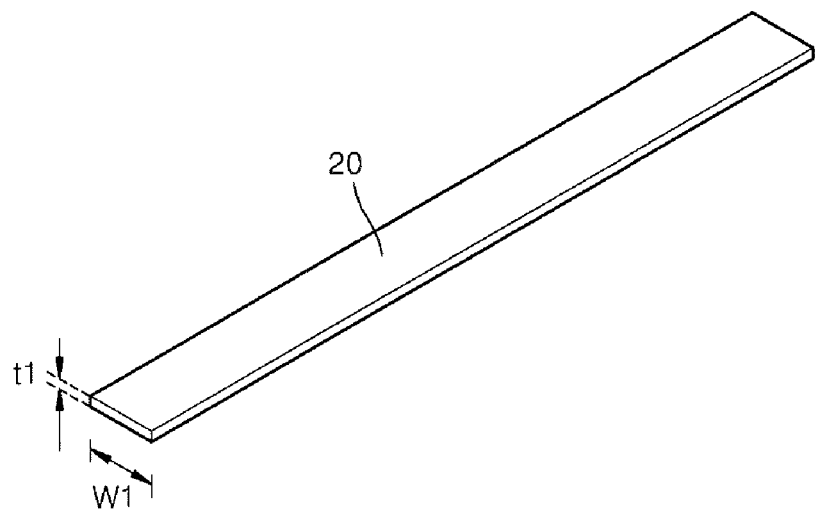
FIG. 2 is a perspective view of an optoelectric transmission metal track of the optoelectric PCB of FIG. 1, according to an embodiment of the present invention.

FIG. 1 is a perspective view of an optoelectric printed circuit board (PCB) according to an embodiment of the present invention, and FIG. 2 is a perspective view of an optoelectric transmission metal track 20 of the optoelectric PCB of FIG. 1, according to an embodiment of the present invention.

Referring to FIG. 1, the optoelectric PCB includes a substrate 10 and a dielectric layer 30 formed on the substrate 10. The dielectric layer 30 includes the optoelectric transmission metal track 20.

The substrate 10 may be formed of silicon or polyimide.

A lower dielectric layer 31 is formed on the substrate 10. In detail, a low loss polymer (e.g., ZP50, Trade Marked ChemOptics, refractive index n=1.5000, @1550 nm) is rotationally coated to have a thickness of 20 mm and is thermally hardened in an oven at 250° C. in a nitrogen atmosphere for 2 hours. The low loss polymer may be fluorinated poly arylene ether (FPAE). Using the low loss polymer, optical propagation distance can be increased. That is, optical loss during optical proceeding should be reduced with respect to the propagation distance. Accordingly, for securing sufficient optical propagation distance in the present invention, a low loss polymer can be used as the dielectric layer 30.

A metal layer is formed to a thickness of 14 nm on the lower dielectric layer 31 using a thermal deposition method. Using photoresist, an optical lithography method and a wet etching method, the metal layer is etched to a width of 10 mm to form the optoelectric transmission metal track 20. The metal layer may be a transition metal such as a noble metal group, that is, Group 1B elements such as gold, silver, copper, etc., or a transition metal such as aluminium or an alloy thereof. These metals contact the dielectric layer 30 to easily induce generation of surface plasmon polaritons and have excellent electric conductivity.

A low loss polymer (ZP50) is rotationally coated to a thickness of 20 mm on the lower dielectric layer 31, on which the optoelectric transmission metal track 20 is formed, and is thermally hardened in an oven at 250° C. in a nitrogen atmosphere for 2 hours to form an upper dielectric layer 32.

Next, the resultant material is cut in a predetermined form to complete a structure in which the optoelectric transmission metal track 20 is formed.

Referring to FIG. 2, the optoelectric transmission metal track 20 has a thickness t1 and a width w1. Here, t1 is 5 to 200 nm, and w1 is 2 to 100 μm. The smaller the thickness t1 of the optoelectric transmission metal track 20, the more propagation energy is radiated to the optoelectric transmission metal track 20. The greater the propagation mode, the easier the contact between an optical receiver and an optical transmitter. However, when the thickness t1 of the optical transmission metal track 20 is smaller than a predetermined value, resistance increases, thereby generating much heat. Thus electricity may not be transmitted efficiently. Accordingly, the thickness t1 of the optoelectric transmission metal track 20 may be 5 to 200 nm.

Electricity and light are transmitted simultaneously through the optoelectric transmission metal track 20 formed in the above-described manner. In detail, electricity is transmitted through the optoelectric transmission metal track 20, and light is transmitted through surface plasmon polaritons generated at the interface between the optoelectric transmission metal track 20 and the dielectric layer 30. Since the frequencies of the light and the electricity are remarkably different, interference does not occur during simultaneous transmission. Thus, the optoelectric transmission metal track 20 can be used in an optoelectric PCB in which light and electricity are transmitted simultaneously. For example, using such an optoelectric PCB, high-speed data such as moving images or three-dimensional images are transmitted by optical signals, and low-speed data or electricity is transmitted by electrical signals.

Figure 3:
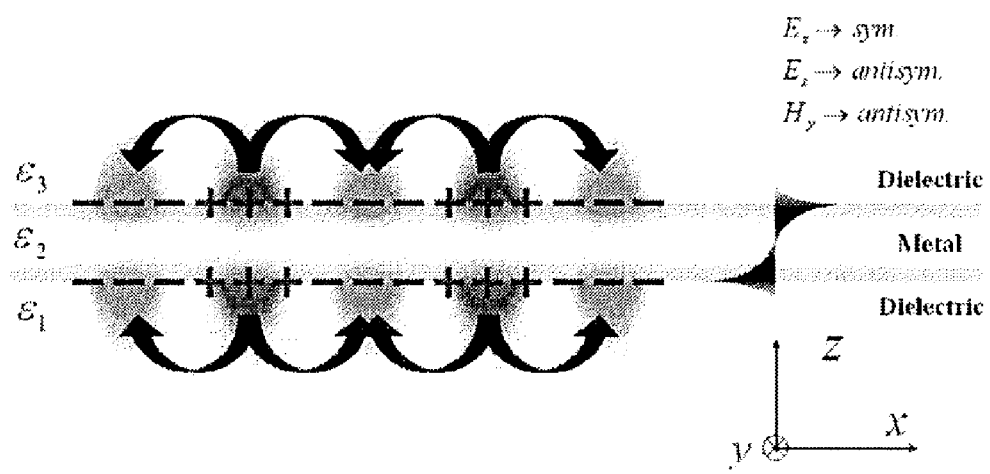
FIGS. 3 and 4 are schematic views for explaining optical transmission.
Figure 4:
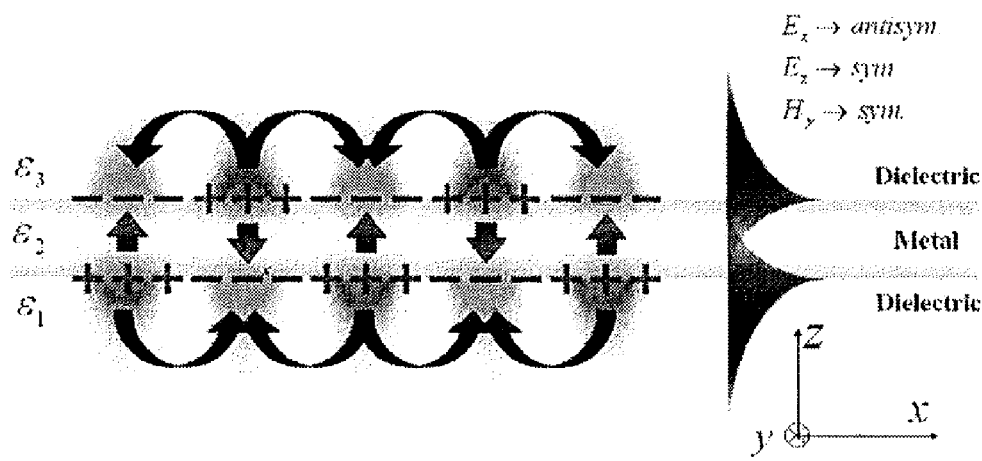

FIGS. 3 and 4 are schematic views for explaining optical transmission.

Referring to FIG. 3, surface plasmon polaritons generated at an optoelectric transmission metal track, a dielectric layer, and the interface between the optoelectric transmission metal track and the dielectric layer are coupled to form an asymmetric mode which is strongly confined in the optoelectric transmission metal track.

Otherwise, referring to FIG. 4, surface plasmon polaritons are coupled to form a symmetric mode having identical evanescent tails above and below the dielectric layer, being spread apart by several micrometers.

The surface plasmon polaritons form an asymmetric mode or a symmetric mode and are transmitted in the form of waves along the optoelectric transmission metal track.

Figure 5:
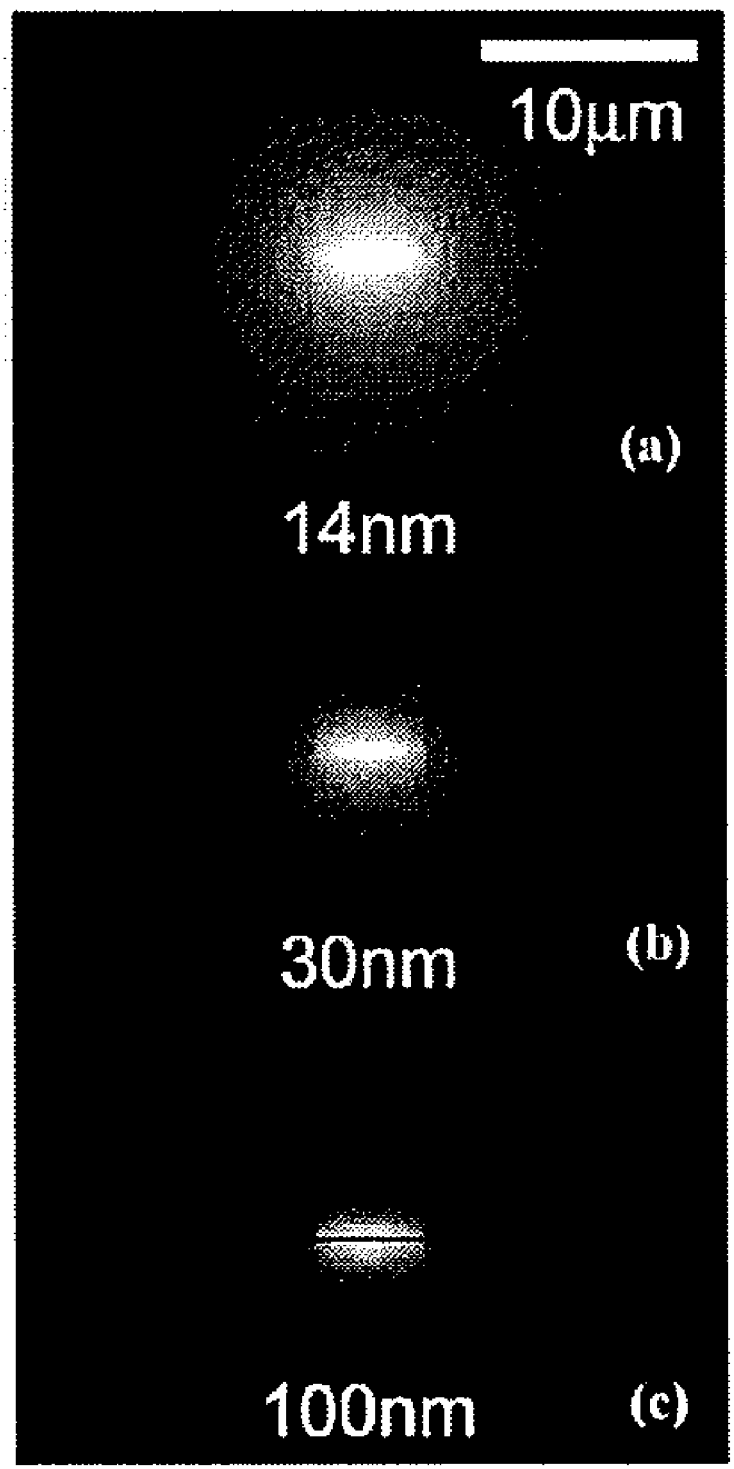
FIG. 5 is an image showing the near field distribution occurring according to the variation of the thickness of an optoelectric transmission metal track of an optoelectric PCB according to an embodiment of the present invention after optical transmission.

FIG. 5 is an image showing the near field distribution occurring according to the variation of the thickness of an optoelectric transmission metal track of an optoelectric PCB according to an embodiment of the present invention after optical transmission.

FIG. 5 illustrates the distribution of the near field which occurs after surface plasmon polaritons are propagated 10 mm in a symmetric mode when the optoelectric transmission metal track has a thickness of 14 nm, 30 nm, and 100 nm, respectively.

Referring to FIG. 5, the smaller the thickness of the optoelectric transmission metal track, the greater the optical propagation. This is because surface plasmon polaritons are strongly confined in the optoelectric transmission metal track and tails into the dielectric layer are extended by an exponential function. Accordingly, the thickness of the optoelectric transmission metal track may also affect the optical propagation distance. That is, the smaller the thickness of the optoelectric transmission metal track, the greater the optical propagation, and the easier the contact between an optical receiver and an optical transmitter.

Also, the optoelectric transmission metal track is used for electric transmission. During electric transmission, the smaller the thickness of the optoelectric transmission metal track, the greater the resistance, thereby increasing the amount of the generated heat. Thus, for efficient electric transmission, the thickness of the optoelectric transmission metal track cannot be reduced unlimitedly.

Thus, the thickness of the optoelectric transmission metal track a may be 5 to 200 nm.

Also, optical propagation of 10 mm or more is possible using the optoelectric PCB according to the current embodiment of the present invention. Optical propagation in the above-described manner is generally referred to as a long-range surface plasmon polariton (LR-SPP).

Accordingly, the present invention can be applied to an optoelectric PCB made using long-range surface plasmon polaritons and in applications of the optoelectric PCB In other words, the optoelectric PCB according to the present invention can transmit optical and electrical signals simultaneously using surface plasmon polaritons generated at the interface between the optoelectric transmission metal track and the dielectric. That is, high speed and large capacity optical data, and low speed data and electricity can be transmitted using the optoelectric transmission metal track for generation of the surface plasmon polaritons.

Figure 6:
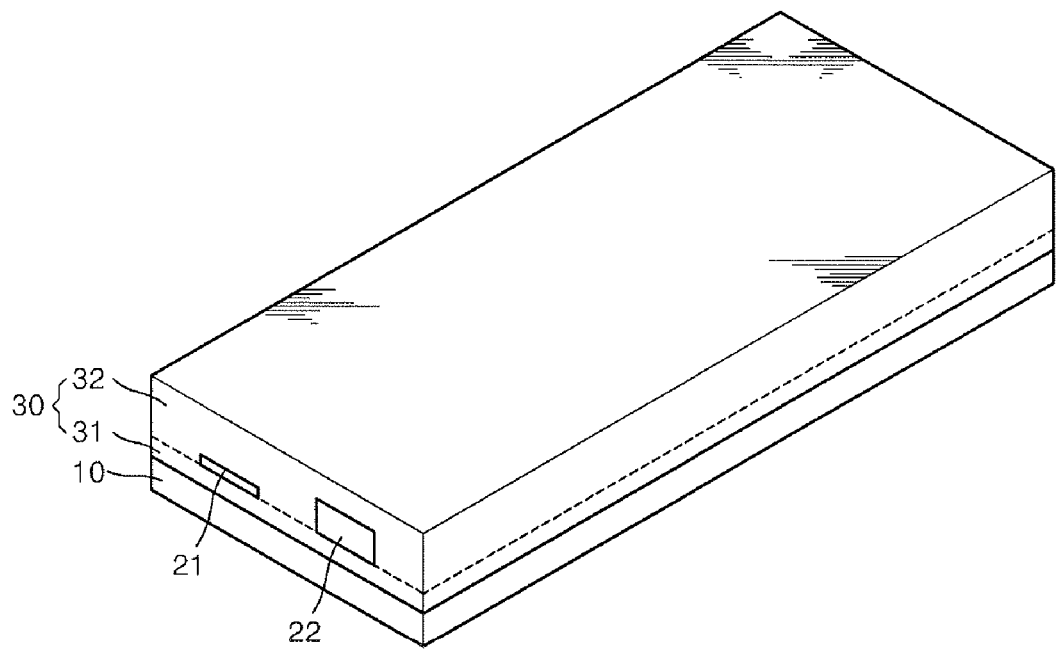
FIG. 6 is a perspective view of an optoelectric PCB according to another embodiment of the present invention.
Figure 7:
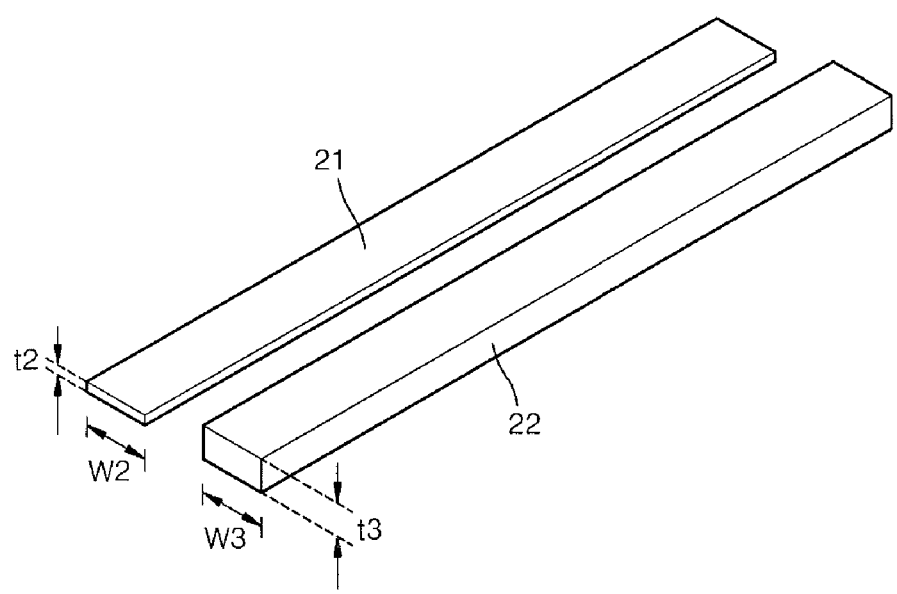
FIG. 7 is a perspective view illustrating an optical transmission metal track and an electric transmission metal track of the optoelectric PCB of FIG. 6, according to an embodiment of the present invention.

FIG. 6 is a perspective view of an optoelectric PCB according to another embodiment of the present invention. FIG. 7 is a perspective view illustrating an optical transmission metal track 21 and an electric transmission metal track 22 of the optoelectric PCB of FIG. 6, according to an embodiment of the present invention.

Referring to FIGS. 6 and 7, the optoelectric PCB includes a substrate 10 and a dielectric layer 30 formed on the substrate 10. A first metal layer is formed on a lower dielectric layer 31 of the dielectric layer 30. The first metal layer may be formed to a thickness t2 of the optical transmission metal track 21 or to a thickness t3 of the electric transmission metal track 22.

When the first metal layer is formed to the thickness t2 of the optical transmission metal track 21, a first etching mask is formed for forming the optical transmission metal track 21 to have a width w2 and the electric transmission metal track 22 to have a width w3. The first metal layer is etched using the first etching mask to form the optical transmission metal track 21 having a thickness t1 and the electric transmission metal track 22 having a thickness t2. Then the first etching mask is removed and a deposition mask exposing the electric transmission metal track 22 is formed. Using the deposition mask, a second metal layer having a thickness t3-t2 is further formed on the exposed electric transmission metal track 22.

Accordingly, the thickness of the electric transmission metal track 22 is t3, which is greater than the thickness t2 of the optical transmission metal track 21. Here, the second metal layer further deposited may be the same metal as the first metal layer or may also be a different metal.

When the first metal layer is formed to the thickness t3 of the optical transmission metal track 21, the optical transmission metal track 21 having the thickness t3 and the electric transmission metal track 22 having the thickness t3 are formed using the first etching mask. Then the first etching mask is removed and a second etching mask exposing the optical transmission metal track 21 is formed on the resultant material. Then the optical transmission metal track 21 is etched to a thickness t3-t2 using the second etching mask. Accordingly, the optical transmission metal track 21 is formed to the thickness t2 and the electric transmission metal track 22 is formed to the thickness t3.

An upper dielectric layer 32 is formed on the resultant material where the optical transmission metal track 21 and the electric transmission metal track 22 are formed. The dielectric layer 30 includes the lower dielectric layer 31 and the upper dielectric layer 32. Referring to FIG. 7, the thickness t3 of the electric transmission metal track 22 may be greater than the thickness t2 of the optical transmission metal track 21. As described with reference to FIG. 5, the thickness of the optical transmission metal track 21 may be relatively small and the thickness of the electric transmission metal track 22 may be relatively great in order to increase the light propagation distance. In detail, the thickness of the optical transmission metal track 21 may be 5 to 200 nm, and the thickness of the electric transmission metal track 22 may be 100 nm to 5 mm.

In the optoelectric PCB according to the current embodiment of the present invention, light can be transmitted through surface plasmon polaritons generated at the interface between the optical transmission metal track 21 and the dielectric layer 30 and electricity can be transmitted through the electric transmission metal track 22. Accordingly, light and electricity can be transmitted using one PCB through different metal tracks.

Figure 8:
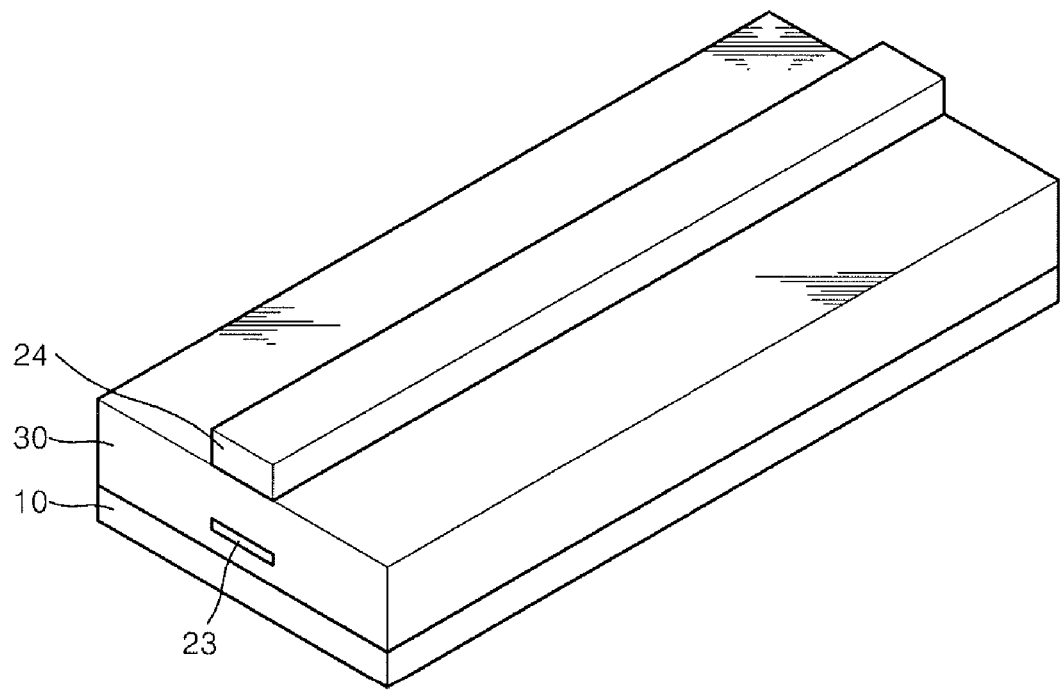
FIG. 8 is a perspective view of an optoelectric PCB according to another embodiment of the present invention.

FIG. 8 is a perspective view illustrating an optoelectric PCB according to another embodiment of the present invention.

FIG. 8 illustrates an optoelectric PCB in which an optical transmission metal track 23 and an electric transmission metal track 24 are formed separately as described with reference to FIG. 7. In the optoelectric PCB according to the current embodiment of the present invention, the optical transmission metal track 23 is formed to be included in a dielectric layer 30 and the electric transmission metal track 24 is formed on the dielectric layer 30. The optoelectric PCB according to the current embodiment of the present invention is first formed as the optoelectric PCB of FIG. 1, and then the electric transmission metal track 24 is formed on the dielectric layer 30 additionally. The optoelectric transmission metal track 20 included in the optoelectric PCB of FIG. 1 can be used as the optical transmission metal track 23 of the optoelectric PCB illustrated in FIG. 8 according to the current embodiment of the present invention.

Figure 9:
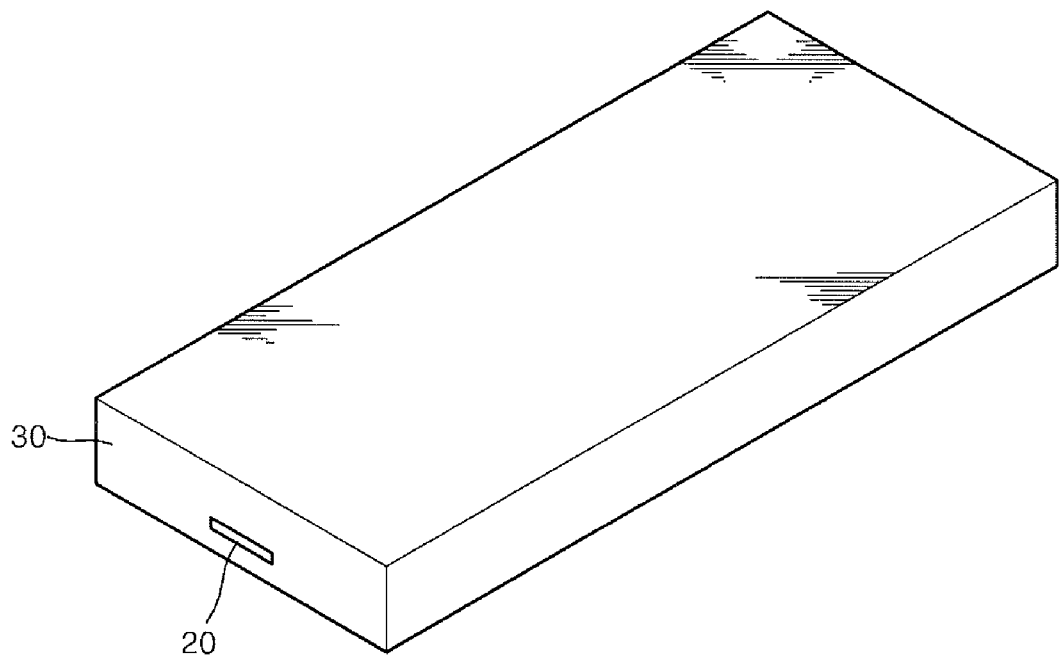
FIGS. 9 through 11 are perspective views illustrating optoelectric PCBs not including a substrate according to other embodiments of the present invention.
Figure 10:
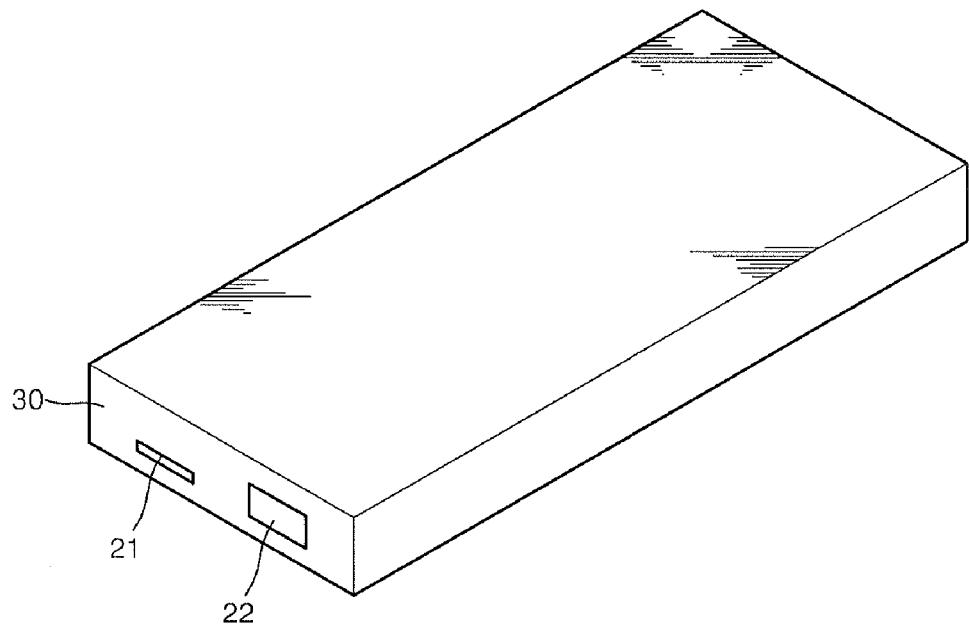
Figure 11:
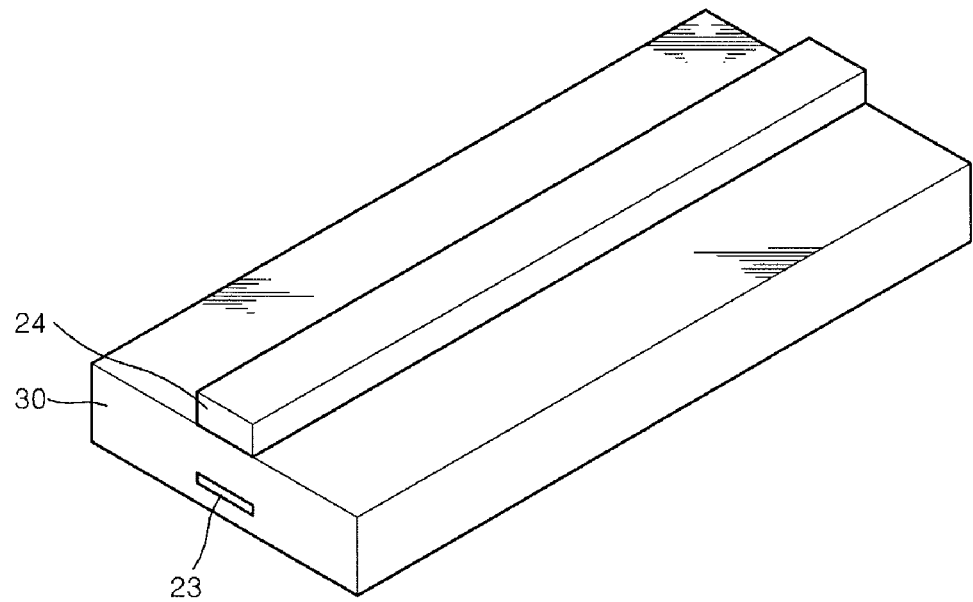

FIGS. 9 through 11 are perspective views illustrating optoelectric PCBs not including a substrate according to other embodiments of the present invention.

FIGS. 9 through 11 illustrate optoelectric PCBs similar to the optoelectric PCBs of FIGS. 1, 6, and 7, respectively; however, the optoelectric PCBs of FIGS. 9 through 11 have no substrates. Thus, flexible optoelectric PCBs that can be bent or folded can be manufactured according to an embodiment of the present invention.

As described above, a method of optoelectric transmission using an optoelectric PCB including an optoelectric transmission metal track and a low loss polymer dielectric layer is provided. In detail, electricity can be transmitted through the optoelectric transmission metal track, and light can be transmitted using surface plasmon polaritons generated at the interface between the optoelectric transmission metal track and the dielectric layer. In particular, light can be efficiently transmitted a desired distance using the dielectric layer formed of a low loss polymer. Also, the optical transmission metal track can be formed of transition metals such as noble metals or aluminium or an alloy thereof, and thus, electricity can be efficiently transmitted. Accordingly, light and electricity can be transmitted using the same optoelectric PCB using the above described transmission method. In addition, since the transmission method does not use multi-mode transmission, transmission speed can be easily increased.

Also, an optoelectric PCB including an optoelectric transmission metal track and a dielectric layer can be provided according to the present invention. The optoelectric transmission metal track can transmit electricity and light simultaneously using surface plasmon polaritons generated at the interface between the optoelectric transmission metal track and the dielectric layer. In particular, a low loss polymer can be used to form the dielectric layer to transmit light a desired distance. Examples of the low loss polymer include polymers that are carbon-bonded to halogen such as fluorine or heavy hydrogen. Also, the optical transmission metal track can be formed of transition metals such as noble metals or aluminium or an alloy thereof, since these metals have good electrical conductivity and can easily generate surface plasmon polaritons. Accordingly, the optoelectric PCB can efficiently transmit light and electricity.

Furthermore, an optoelectric PCB can be manufactured using materials that are easily available and using a simple process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optoelectric PCB comprising:
at least one optoelectric transmission metal track comprising:
a first metal layer strip; and
a first dielectric layer surrounding the first metal layer strip, wherein the first dielectric layer comprises a low loss polymer,
at least one electric transmission metal track comprising:
a second metal layer strip; and
a second dielectric layer surrounding the first metal layer strip, wherein the second dielectric layer comprises a low loss polymer,
wherein the at least one optoelectric transmission metal track extends in a first direction,
wherein the at least one optoelectric transmission metal track transmits an optical signal along the first direction through surface plasmon polaritons generated at the interface between the first dielectric layer and the first metal layer strip,
wherein the at least one optoelectric transmission metal track transmits a first electric signal along the first direction through the first metal layer strip,
wherein the at least one optoelectric transmission metal track extends in the first direction,
wherein the at least one electric transmission metal track transmits a second electric signal along the first direction through the second metal layer strip,
wherein the second metal layer is thicker than the first metal layer.

2. The optoelectric PCB of claim 1, wherein the first metal layer strip has a thickness of 5 to 200 nm and a width of 2 to 100 µm.

3. The optoelectric PCB of claim 1, wherein the second metal layer strip has a thickness of 100 nm to 5 mm and a width of 100 nm to 5 mm.

4. The optoelectric PCB of claim 1, wherein the low loss polymer comprises fluorinated polyarylene ether.

5. The optoelectric PCB of claim 1, wherein the low loss polymer comprises halogen or heavy hydrogen.

6. The optoelectric PCB of claim 1, wherein at least one of the first metal layer strip and the second metal layer strip is selected from the group consisting of aluminum, copper, silver, gold, rhenium, ruthenium, rhodium, palladium, osmium, iridium, platinum, and alloys thereof.

7. The optoelectric PCB of claim 1 further comprises
a substrate formed on at least one of the first dielectric layer and the second dielectric layer.

* * * * *